(12) United States Patent
Okada

(10) Patent No.: US 11,768,444 B2
(45) Date of Patent: Sep. 26, 2023

(54) IMPRINT APPARATUS AND METHOD OF MANUFACTURING ARTICLE

(71) Applicant: CANON KABUSHIKI KAISHA, Tokyo (JP)

(72) Inventor: Tetsuji Okada, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 663 days.

(21) Appl. No.: 16/696,827

(22) Filed: Nov. 26, 2019

(65) Prior Publication Data
US 2020/0183270 A1     Jun. 11, 2020

(30) Foreign Application Priority Data

Dec. 6, 2018 (JP) .................................. 2018-228918

(51) Int. Cl.
*G03F 7/00* (2006.01)
*G03F 7/20* (2006.01)

(52) U.S. Cl.
CPC ........ *G03F 7/70783* (2013.01); *G03F 7/0002* (2013.01); *G03F 7/70* (2013.01)

(58) Field of Classification Search
CPC ..................... G03F 7/70783; G03F 2007/2067
See application file for complete search history.

(56) References Cited

U.S. PATENT DOCUMENTS

| 6,927,839 B2 * | 8/2005 | Taniguchi ........... G03F 7/70783 355/75 |
| 9,581,916 B2 * | 2/2017 | Ottens ................. G03F 7/70341 |
| 10,870,225 B2 * | 12/2020 | Harayama ............. G03F 7/0002 |

FOREIGN PATENT DOCUMENTS

| JP | H06196381 A | 7/1994 |
| JP | 2008-504141 A | 2/2008 |
| JP | 2018-093122 A | 6/2018 |
| KR | 2016-0130802 A | 11/2016 |
| KR | 2017-0069945 A | 6/2017 |

* cited by examiner

*Primary Examiner* — Hung V Nguyen
(74) *Attorney, Agent, or Firm* — Canon U.S.A., Inc., IP Division

(57) ABSTRACT

An imprint apparatus that cures an imprint material on a substrate in a state where a mold is in contact with the imprint material includes a substrate holding unit having a plurality of holding regions that holds the substrate, and a control unit configured to control a pressure in each of the holding regions independently, wherein the control unit controls the pressure based on at least one of shape information and distortion information of the substrate, at least when the imprint material is cured.

5 Claims, 6 Drawing Sheets

XZ CROSS SECTION OF A AND B

XZ CROSS SECTION OF C AND D

IMPRINT APPARATUS AND METHOD OF MANUFACTURING ARTICLE

BACKGROUND

Field of the Disclosure

The present disclosure relates to an imprint apparatus and a method of manufacturing an article.

Description of the Related Art

An imprint technology for transferring a pattern formed on a mold to a substrate has been receiving attention as one of lithography technologies used for manufacturing semiconductor devices. In an imprint apparatus using the imprint technology, an imprint material, which is a curable composition is disposed on a substrate, and the imprint material is brought into contact with a mold and cured in such a contact state. Subsequently, the mold is separated from the cured imprint material on the substrate, so that a pattern of the mold is transferred to the substrate.

The imprint apparatus is expected to transfer the pattern of the mold to the substrate with high accuracy. To align the position of a pattern area of a mold and the position of a transfer area on a substrate accurately, Japanese Unexamined Patent Application Publication (Translation of PCT Application) No. 2008-504141 discusses a technology for correcting the shape of a pattern by applying a force from a side face of the mold.

Multi-layering of circuit patterns has been advanced, as semiconductor devices have been highly integrated. A multilayered substrate may have warpage due to accumulation of, for example, film distortion that occurs during film formation. This warpage distorts the shape of a transfer area on a substrate, and thus transfer accuracy, i.e., overlay accuracy deteriorates.

The technology discussed in Japanese Unexamined Patent Application Publication (Translation of PCT Application) No. 2008-504141 is limited in terms of the number of actuators that can be installed on the side face of the mold. Therefore, this technology is suitable for correction of a magnification or a low-order simple shape such as a rhombus, but is not suitable for correction of a second-or-higher-order distortion attributable to warpage of the substrate.

SUMMARY

The present disclosure is directed to an imprint apparatus, an imprint method, and a method of manufacturing an article that are capable of improving overlay accuracy.

According to an aspect of the present invention, an imprint apparatus that cures a curable composition on a substrate in a state where a mold is in contact with the curable composition includes a substrate holding unit having a plurality of holding regions that holds the substrate, and a control unit configured to control a pressure of the plurality of holding regions, wherein the control unit controls the pressure based on at least one of shape information and distortion information of the substrate, at least when the curable composition is cured.

According to the present disclosure, it is possible to provide an imprint apparatus, an imprint method, and a method of manufacturing an article that are advantageous in terms of overlay accuracy.

Further features of the present invention will become apparent from the following description of exemplary embodiments with reference to the attached drawings.

DESCRIPTION OF THE EMBODIMENTS

Figure 1:
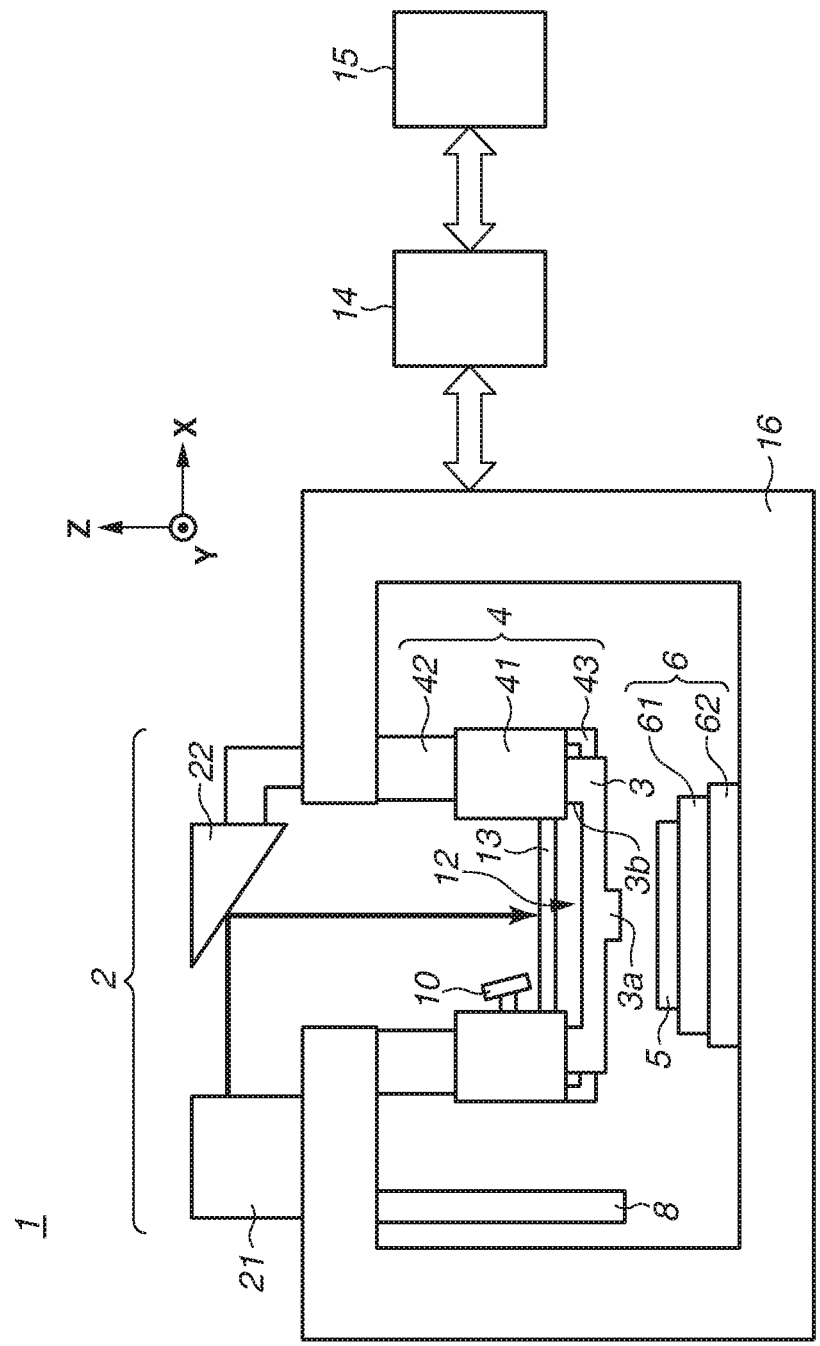
FIG. 1 is a diagram illustrating a configuration of an imprint apparatus as an aspect of the present invention.

Exemplary embodiments of the present invention will be described below with reference to the attached drawings. The same members are provided with the same reference numbers in the drawings, and overlapping description thereof will be omitted below.

A summary of an imprint apparatus according to a first exemplary embodiment will be described. The imprint apparatus is a molding apparatus that brings an imprint material, which is a photocurable composition supplied onto a substrate, into contact with a mold, and applies energy for curing to the imprint material. The imprint apparatus thereby forms a pattern of a cured material to which a concave-convex pattern of the mold is transferred.

FIG. 1 is a diagram illustrating a configuration of an imprint apparatus 1 in the exemplary embodiment. The imprint apparatus 1 adopts a photo-curing method that cures an imprint material by irradiation of ultraviolet light, but is not limited to this method, and can adopt, for example, a heat-curing method that cures an imprint material by heat input. In each of figures to be described below, a direction parallel to an irradiation axis of ultraviolet light with respect to a mold is indicated by a Z-axis, and directions orthogonal to each other within a plane perpendicular to the Z-axis are indicated by an X-axis and a Y-axis, in an XYZ coordinate system.

The imprint apparatus 1 includes an irradiation unit 2, a mold stage 4 that holds a mold 3, a substrate stage 6 that holds a substrate 5, a coating unit 8 that supplies an imprint material, an alignment optical system 10, a control unit 14, and a console unit 15.

The irradiation unit 2 includes a light source unit 21 that emits light for curing an imprint material on the substrate 5, and an optical member 22 that guides the light emitted from the light source unit 21 to the imprint material on the substrate 5. The irradiation unit 2 irradiates the imprint material on the substrate 5 with the light via the mold 3.

The optical member 22 includes an optical element for adjusting the light emitted from the light source unit 21 to light appropriate for an imprint process.

The mold 3 has a rectangular outer-periphery shape, and has a pattern portion 3a that is three-dimensionally formed on a surface facing the substrate 5. A material for the mold 3 is a material that can allow ultraviolet light to pass therethrough, such as quartz glass. The mold 3 can include a cavity (a concave portion) 3b for enabling easy deformation of the mold 3. The cavity 3b has a circular planar shape, and has a thickness appropriately set based on the shape and the material of the mold 3. Further, a light transmission member 13 is provided in an opening region within the mold stage 4 to be described below. The light transmission member 13 is provided so that a space 12 surrounded by a portion of this opening region and the cavity 3b is formed as an enclosed space. A pressure within the space 12 can be controlled by a pressure adjustment device (not illustrated).

The mold stage 4 includes a mold holding unit 41 that holds the mold 3 by a vacuum suction force or an electrostatic force, and a mold moving unit 42 that moves the mold holding unit 41 in a Z direction.

The mold holding unit 41 and the mold moving unit 42 each have an opening in the center (inside) so that the imprint material on the substrate is irradiated with the light from the irradiation unit 2.

The mold moving unit 42 includes an actuator such as a voice coil motor and an air cylinder.

The mold moving unit 42 moves the mold holding unit 41 (the mold 3) in the Z direction, in order to bring the mold 3 into contact with the imprint material on the substrate 5, or separate the mold 3 from the imprint material on the substrate 5.

The mold moving unit 42 can have a function of adjusting the position of the mold holding unit 41 not only in the Z direction but in an X direction and a Y direction.

Further, the mold moving unit 42 can have a function of adjusting the position of the mold holding unit 41 in a θ (rotation about the Z-axis) direction, and a tilt function for adjusting a tilt of the mold holding unit 41.

The mold stage 4 can further include a mold deforming mechanism 43.

The mold deforming mechanism 43 corrects the shape of the mold 3 (the pattern portion 3a) by applying an external force or displacement to a side face of the mold 3.

The mold deforming mechanism 43 includes, for example, a plurality of actuators, and is configured to pressurize a plurality of points of each side face of the mold 3.

The substrate 5 is, for example, a single crystal silicon substrate or a silicon-on-insulator (SOI) substrate.

Figure 2:
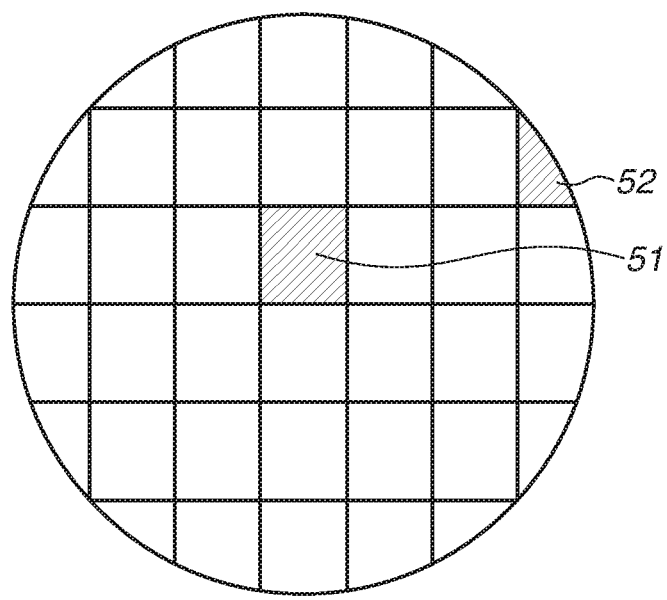
FIG. 2 is a diagram illustrating a shot region of a substrate.

FIG. 2 is a diagram illustrating a layout for a shot region on the substrate 5.

In the present specification, the shot region is a region where a pattern is to be formed by one imprint process.

A region to be subjected to the imprint process is referred to as a target shot region.

The imprint apparatus 1 performs the imprint process each time the target shot region changes.

The imprint process includes at least a step of applying the imprint material to the target shot region, a step of bringing the mold 3 and the imprint material into contact with each other, a step of filling the pattern portion 3a with the imprint material, a step of curing the imprint material, and a step of separating the cured imprint material and the mold 3.

On the substrate 5, the plurality of shot regions is arranged in a matrix.

In the present exemplary embodiment, in order to maximize an effective area (the area of the sum of regions; a pattern is to be transferred to each of the regions) of the substrate 5, the imprint process is performed not only on a shot region 51 in the inside of the substrate 5 but on a peripheral shot region 52 including the outer periphery of the substrate 5.

The peripheral shot region is a shot region having a portion extending off the outer periphery of the substrate 5, and is also referred to as an "incomplete shot region".

The substrate stage 6 includes a substrate holding unit 61 that holds the substrate 5, and a substrate moving unit 62 that moves the substrate holding unit 61 (the substrate 5) in the X direction and the Y direction.

Figure 3A:
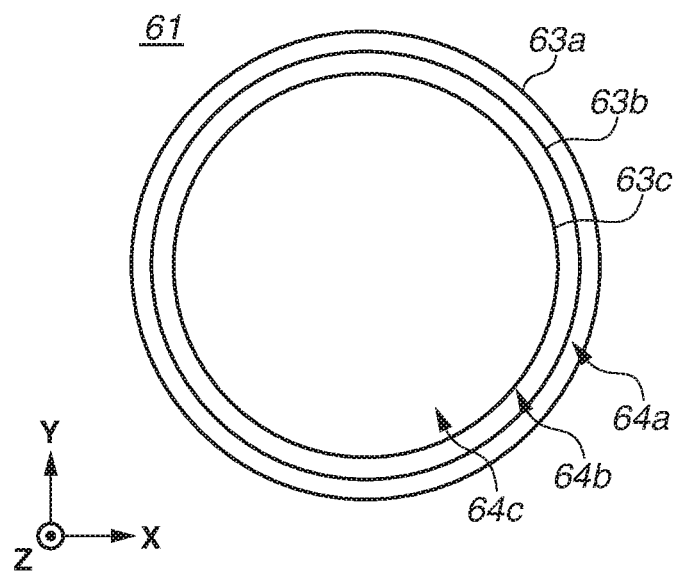
FIGS. 3A and 3B are diagrams each illustrating a substrate holding unit.

FIG. 3A illustrates a plan view of the substrate holding unit 61 as viewed from the mold 3 side.

A plurality of regions 64a, 64b, and 64c partitioned by a plurality of partitions 63a, 63b, and 63c is formed on an upper surface (a surface facing the substrate 5) of the substrate holding unit 61, as illustrated in FIG. 3A. The holding regions 64a, 64b, and 64c are each capable of independently receiving an applied positive pressure or negative pressure, and are concentrically segmented.

In the example in FIG. 3A, the plurality of holding regions 64a, 64b, and 64c is formed by standing the partitions 63a, 63b, and 63c on an upper surface of the substrate holding unit 61. However, the holding regions 64a, 64b, and 64c can each be a holding groove cut into the upper surface of the substrate holding unit 61.

Figure 3B:
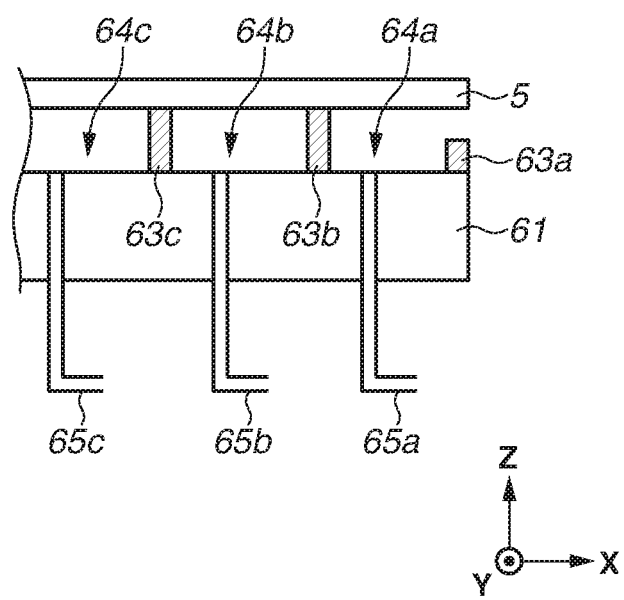

FIG. 3B illustrates an XZ cross section of the substrate holding unit 61 holding the substrate 5. The holding regions 64a, 64b, and 64c each form a closed space using the substrate 5.

The holding regions 64a, 64b, and 64c are connected to a pressure adjustment unit having a pressure application unit such as a pump (not illustrated) via pipes 65a, 65b, and 65c, so that the pressures in the respective closed spaces can be adjusted independently of each other. The substrate 5 can be deformed to curve in the Z direction by controlling the pressure in each of the closed spaces.

In particular, the height of the outermost partition 63a is made to be lower than the height of each of the other partitions on the inner side thereof, so that the region 64a of the substrate 5 can be easily deformed to have a slope downward to the outer periphery side.

The number of the holding regions of the substrate holding unit 61 is three, but is not limited thereto, and can be any number as far as the number is two or more.

The substrate moving unit 62 includes, for example, a linear motor, and can be configured of a plurality of driving systems such as a coarse movement drive system and a fine movement drive system.

The substrate moving unit 62 can be configured to have a function of adjusting the position of the substrate holding unit 61 not only in the X direction and the Y direction but in the Z direction.

Further, the substrate moving unit 62 can be configured to have a function of adjusting the position of the substrate holding unit 61 in a θ (rotation about the Z-axis) direction, and a tilt function for adjusting the tilt of the substrate holding unit 61.

For example, an encoder system is used for measurement of the position of the substrate stage 6. The encoder system includes a scale provided in a housing 16, and a head (optical equipment) provided on the substrate moving unit 62. However, the measurement of the position of the substrate stage 6 is not limited to the encoder system, and an interferometer system configured of a laser interferometer provided in the housing 16 and a reflecting mirror provided on the substrate moving unit 62 can be used.

The alignment optical system 10 measures a difference in position between an alignment mark formed on the substrate 5 and an alignment mark formed on the mold 3 in the direction of each of the X-axis and the Y-axis. The position of the substrate stage 6 can be adjusted based on the measured difference in position.

The imprint apparatus 1 can measure a distance to an upper surface of the substrate 5 using a height measuring device (not illustrated).

The height measuring device can be an external device of the imprint apparatus 1. In that case, data measured by the height measuring device provided as the external device can be stored into a memory and used by the imprint apparatus 1.

The control unit 14 includes, for example, a computer including a central processing unit (CPU) and a memory, and comprehensively controls each portion of the imprint apparatus 1 based on a program stored in the memory.

The control unit 14 transfers a pattern of the mold 3 to the imprint material on the substrate 5 by controlling, for example, the operation and the adjustment of each portion of the imprint apparatus 1.

The console unit 15 includes a computer including an input device such as a keyboard and a mouse, and a display. The console unit 15 is an interface for enabling the imprint apparatus 1 (the control unit 14) and a user to share information. The console unit 15 transmits (outputs) information about the imprint process input by the user to the control unit 14.

The information about the imprint process input into the console unit 15 is recorded into the computer as a recipe parameter or a log, and can be checked before and after the imprint process.

In the present exemplary embodiment, the console unit 15 also functions as a user interface for inputting a pressure for each of the holding regions 64a, 64b, and 64c.

Further, in the present exemplary embodiment, the control unit 14 functions as an acquisition unit that acquires the pressure for each of the holding regions 64a, 64b, and 64c input into the console unit 15.

The control unit 14 can be configured integrally with other portions of the imprint apparatus 1 (within a common housing), or can be configured separately from other portions of the imprint apparatus 1 (within a separate housing).

The imprint process in the imprint apparatus 1 will be described with reference to FIGS. 4A and 4B.

The control unit 14 comprehensively controls each portion of the imprint apparatus 1 as described above, so that the imprint process is performed. FIG. 4A is a flowchart illustrating the imprint process in the imprint apparatus 1.

Figure 4A:
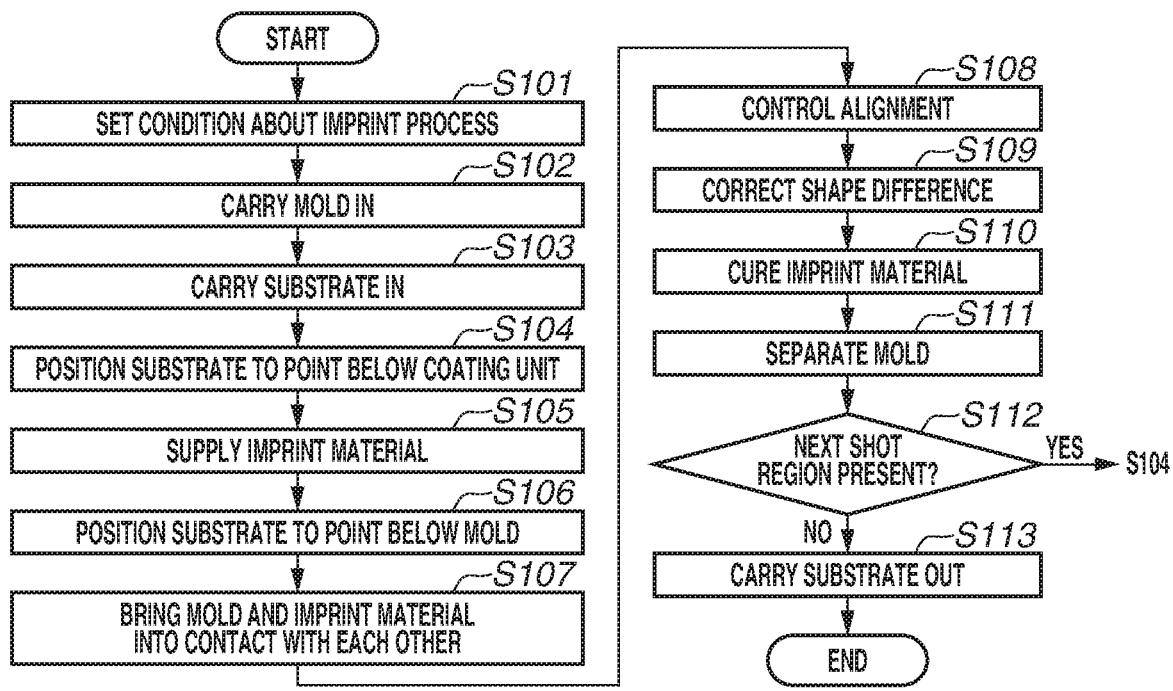
FIG. 4A is a flowchart illustrating an imprint process in the imprint apparatus.
Figure 4B:
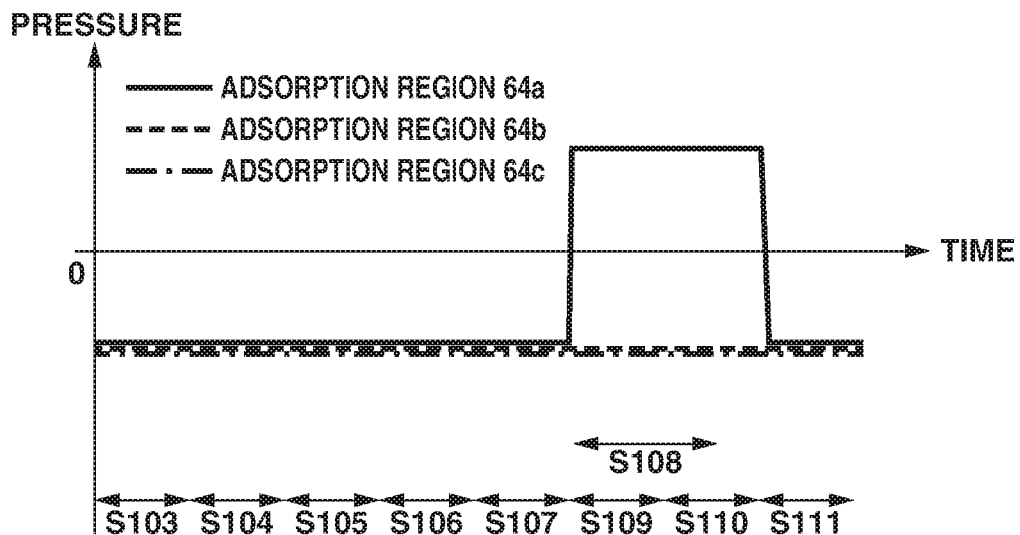
FIG. 4B illustrates an example of a pressure value of a holding region in each step of the imprint process in FIG. 4A.

FIG. 4B is a diagram illustrating an example of a pressure value of each of the holding regions 64a, 64b, and 64c, in each step of the imprint process in FIG. 4A.

In step S101, the control unit 14 acquires a condition of an imprint process input into the console unit 15 by a user.

Here, the condition of the imprint process includes the pressure value in each of the holding regions 64a, 64b, and 64c.

In step S102, the mold 3 is carried in to the imprint apparatus 1. Specifically, a mold conveyance mechanism (not illustrated) carries (conveys) the mold 3 in to a position below the mold holding unit 41 of the imprint apparatus 1, and then the mold 3 is held by the mold holding unit 41.

In step S103, the substrate 5 is carried in to the imprint apparatus 1. Specifically, a substrate conveyance mechanism (not illustrated) carries (conveys) the substrate 5 in to a position on the substrate holding unit 61 of the imprint apparatus 1, and then the substrate 5 is held by the substrate holding unit 61.

In step S104, the substrate 5 is positioned to be below the coating unit 8 (at a position where an imprint material is supplied). Specifically, the substrate moving unit 62 moves the substrate holding unit 61 holding the substrate 5 so that a target shot region of the substrate 5 is located below the coating unit 8.

In step S105, the coating unit 8 applies an imprint material to the target shot region of the substrate 5.

In step S106, the substrate 5 is positioned to be below the mold 3. Specifically, the substrate moving unit 62 moves the substrate holding unit 61 holding the substrate 5 so that the target shot region of the substrate 5 supplied with the imprint material is located below the pattern portion 3a of the mold 3.

In step S107, the mold 3 and the imprint material on the substrate 5 are brought into contact with each other. Specifically, the mold moving unit 42 moves the mold 3 in the Z direction (lowers the mold 3) to bring the pattern portion 3a of the mold 3 and the imprint material on the target shot region of the substrate 5 into contact with each other, i.e., to shorten the distance between the mold 3 and the substrate 5.

In step S108, the alignment optical system 10 detects the difference in position between the alignment mark formed on the substrate 5 and the alignment mark formed on the mold 3 in the direction of each of the X-axis and the Y-axis. The substrate stage 6 is finely driven based on the detected difference in position, so that the mold 3 and the substrate 5 are relatively aligned.

In step S109, the shape difference between the pattern portion 3a of the mold 3 and the target shot region of the substrate 5 is corrected. Specifically, the pressure of each of the holding regions 64a, 64b, and 64c is changed so that the shape of the pattern portion 3a and the shape of the target shot region coincide with each other. The control unit 14 acquires a target value for the pressure of each of the holding regions 64a, 64b, and 64c in step S101. The correction of the shape difference using the pressure of each of the holding regions 64a, 64b, and 64c will be described in detail below. The order of step S108 and step S109 can be reversed, or step S108 and step S109 can be performed simultaneously.

In step S110, the imprint material is cured in a state where the mold 3 and the imprint material on the substrate 5 are in contact with each other. Specifically, the irradiation unit 2 cures the imprint material by irradiating the imprint material being in contact with the pattern portion 3a of the mold 3 with the light.

In step S111, the mold 3 is separated from the cured imprint material on the substrate 5. Specifically, the mold moving unit 42 moves the mold 3 in the Z direction (raises the mold 3) to remove the mold 3 from the imprint material on the substrate 5, i.e., to lengthen the distance between the mold 3 and the substrate 5.

In step S112, the control unit 14 determines whether a shot region where the pattern is to be formed next is present. In a case where the control unit 14 determines that the shot region is not present (NO in step S112), the process proceeds to step S113. In step S113, the substrate conveyance mechanism (not illustrated) carries the substrate 5 out from the imprint apparatus 1. In a case where the control unit 14 determines that the shot region is present (YES in step S112), the process returns to step S104 to repeat the processes in step S104 to step S112.

The pressure of each of the holding regions is a negative pressure in steps except for step S108, step S109, and step S110, as illustrated in FIG. 4B. This is to prevent the substrate 5 from being separated from the substrate holding unit 61.

On the other hand, the pressure of the holding region 64a is changed to correct the shape difference between the pattern portion 3a and the object shot region of the substrate 5 in step S108, step S109, and step S110. A specific way of determining the pressure will be described below.

As illustrated in FIG. 4B, it is necessary to change the pressure of each of the holding regions 64a, 64b, and 64c to the target pressure, at least before step S110 (curing of the imprint material) begins.

The correction of the shape difference between the pattern portion 3a of the mold 3 and the target shot region of the substrate 5 in step S109 will be described in detail. The shape difference between the pattern portion 3a of the mold 3 and the target shot region of the substrate 5 is caused by distortion of the substrate 5, and this distortion will be described first.

In recent years, multi-layering of circuit patterns has been advanced as semiconductor devices have been highly integrated. A multilayered substrate may have warpage due to accumulation of, for example, film distortion that occurs during film formation.

Figure 5A:
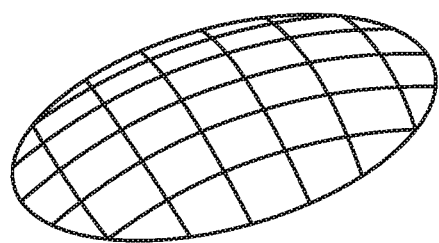
FIGS. 5A, 5B, 5C, 5D, 5E and 5F are diagrams illustrating a correspondence between a warping shape and a distortion of the substrate.
Figure 5B:
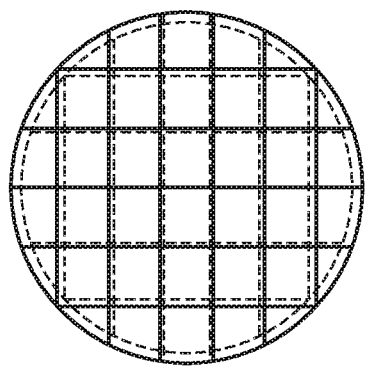
Figure 5C:
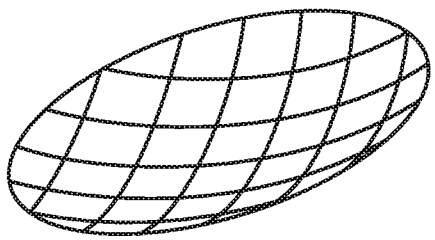
Figure 5D:
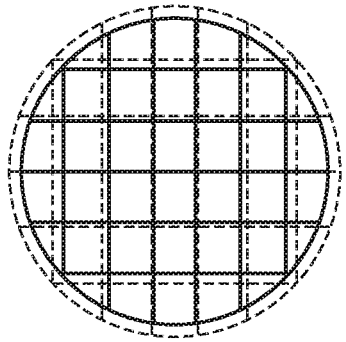

FIGS. 5A to 5F illustrate a correspondence between a warping shape and distortion. FIG. 5A illustrates a disk-shaped substrate warped into an upward convex shape as viewed diagonally from above, and FIG. 5B illustrates this substrate as viewed from above. Similarly, FIG. 5C illustrates a substrate warped into a downward convex shape as viewed diagonally from above, and FIG. 5D illustrates this substrate as viewed from above.

In each of FIGS. 5A to 5D, inner lattice-shaped solid lines form a grid for indicating shot regions.

Dotted lines in each of FIGS. 5B and 5D indicate a grid in a state of no distortion.

As illustrated in FIG. 5B, in the substrate warped into the upward convex shape, distortion expanding from the center of the substrate in a radial direction is formed, and usually, the distortion becomes larger in a portion closer to the outer periphery of the substrate.

Meanwhile, as illustrated in FIG. 5D, in the substrate warped into the downward convex shape, distortion contracting from the center of the substrate in a radial direction is formed, and usually, the distortion becomes larger in a portion closer to the outer periphery of the substrate.

Figure 5E:
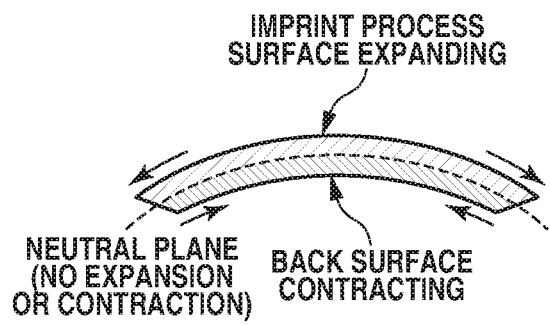
Figure 5F:
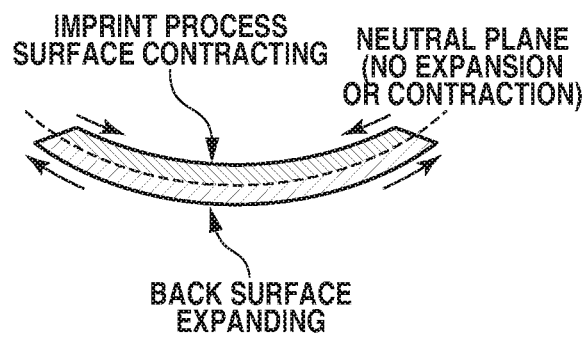

As illustrated in FIGS. 5E and 5F, an imprint process surface expands in the case of the upward convex, whereas the imprint process surface contracts in the case of the downward convex. Therefore, FIG. 5B and FIG. 5D are opposite in terms of the relationship between the dotted lines and the solid lines.

FIG. 5E illustrates a simple upward convex shape as an example of the warping shape. FIG. 5F illustrates a simple downward convex shape as an example of the warping shape.

Other than the upward convex shape and the downward convex shape, a higher order curve shape such as a saddle type can be formed as the warpage of the substrate 5. In any case, however, in general, if a disc is deformed into a curve, this shape has a component of radial distortion, and the distortion tends to be larger in a portion closer to the outer periphery.

FIGS. 5E and 5F each illustrate a shape exaggerated for easy understanding of the state of the warpage and the distortion. In reality, the amount of warpage is about a few μm to a few mm, and the distortion is about a few nm to a few μm, in many cases.

In the present exemplary embodiment, the control unit 14 controls the pressure of each of the holding regions 64a, 64b, and 64c, and thereby corrects the radial distortion of the substrate 5. Here, an incomplete shot region where distortion is large and a correction effect is high will be described as an example.

Figure 6A:
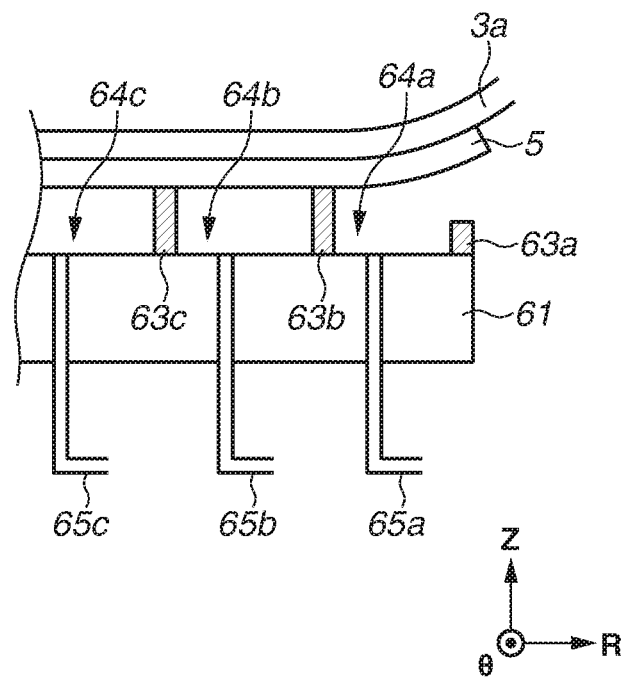
FIGS. 6A and 6B are diagrams each illustrating correction of a shape difference.
Figure 6B:
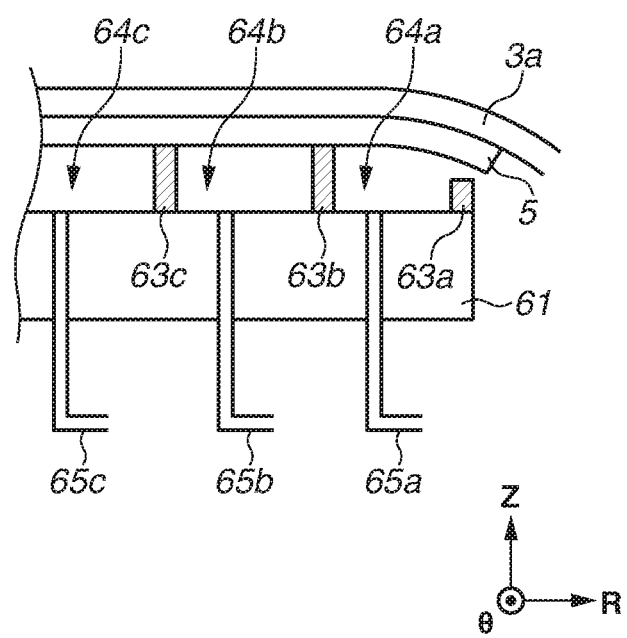

FIG. 6A is a diagram illustrating a case where the pressure of the holding region 64a is set to a positive pressure in a state where the pattern portion 3a and the imprint material are in contact with each other. FIG. 6B is a diagram illustrating a case where the pressure of the holding region 64a is set to a negative pressure in a state where the pattern portion 3a and the imprint material are in contact with each other.

A coordinate system in each of FIGS. 6A and 6B is a cylindrical coordinate system in which a Z-axis is a direction parallel to an irradiation axis of ultraviolet light and an R-axis is a radial direction of the substrate 5. The imprint material is an ultrathin film and thus is not illustrated in FIGS. 6A and 6B.

In the case where the pressure of the holding region 64a is the positive pressure in FIG. 6A, the pattern portion 3a and the substrate 5 are warped into a downward convex. In this case, based on a plate bending theory, a surface on the substrate 5 side of the pattern portion 3a expands in the radial direction, and the surface on the pattern portion 3a side of the substrate 5 contracts in the radial direction. In other words, the target shot region of the substrate 5 contracts in the radial direction, relative to the pattern portion 3a.

On the other hand, in the case where the pressure of the holding region 64a is the negative pressure in FIG. 6B, the pattern portion 3a and the substrate 5 are warped into an upward convex. In this case, based on the plate bending theory, the surface on the substrate 5 side of the pattern portion 3a contracts in the radial direction, and the surface on the pattern portion 3a side of the substrate 5 expands in the radial direction. In other words, the target shot region of the substrate 5 expands in the radial direction, relative to the pattern portion 3a.

In this way, the shape of the target shot region can be expanded or contracted relative to the pattern portion 3a by controlling the pressure of the holding region 64a to the positive pressure or the negative pressure. In addition, the amount of expansion/contraction can be controlled based on the magnitude of the pressure.

In the case where the substrate 5 is warped into the upward convex as illustrated in FIGS. 5A and 5B, the substrate 5 expands in the radial direction. Therefore, in step S109, the pressure of the holding region 64a is set to the positive pressure.

In the case where the substrate 5 is warped into the downward convex as illustrated in FIGS. 5C and 5D, the substrate 5 contracts in the radial direction. Therefore, in step S109, the pressure of the holding region 64a is set to the negative pressure.

An optimum value of the pressure of the holding region 64a can be, for example, acquired by test imprint. The imprint is performed a plurality of times by changing only the pressure of the holding region 64a, and the optimum value is calculated from the amount of a change in overlay by the least-square method. Alternatively, the optimum value of the pressure of the holding region 64a can be determined based on the warping shape of the substrate 5 measured by the height measuring device, e.g., distortion information or shape information of the substrate 5 calculated in a simulation.

Here, because the warping shape of the substrate 5 is a simple shape of either the upward convex or the downward convex, only the pressure of the holding region 64a is changed in step S109, but this is not limitative. The pressure of the holding region 64b or 64c can also be changed depending on the warping shape of the substrate 5. In a case where the warping shape of the substrate 5 varies for each shot region, the pressures of the respective holding regions 64a, 64b, and 64c in step S109 can vary for each shot region.

In the present exemplary embodiment, the holding region of the substrate holding unit 61 is concentrically divided to correct the radial distortion of the substrate 5, but the shape to be divided is not limited to this example. For example, in a case where circumferential distortion of the substrate 5 is large, the partitions of the substrate holding unit can be radially disposed, so that the holding region can be divided in a circumferential direction.

Further, the holding region can be divided by combining the radially disposed partitions and the concentrically disposed partitions. The holding region of the substrate holding unit 61 can be finely divided into a grid to also reduce overlay errors caused by a factor other than the warpage of the substrate 5.

As described above, the shape difference between the pattern portion 3a and the shot region of the substrate 5 can be corrected by controlling the pressure of the holding region of the substrate holding unit 61 in the state where the mold 3 and the imprint material on the substrate 5 are in contact with each other. Therefore, the present exemplary embodiment is beneficial in terms of overlay accuracy.

A second exemplary embodiment will be described. In the second exemplary embodiment, a method of manufacturing an article (such as a semiconductor integrated circuit (IC) element, a liquid crystal display element, or a micro electro mechanical systems (MEMS) element) using the above-described imprint apparatus will be described. The article is manufactured by being processed in a step of exposing a substrate (such as a wafer or a glass substrate) to which a photosensitive agent is applied, a step of developing the substrate (the photosensitive agent), and other known steps of processing the developed substrate, by using the above-described imprint apparatus.

The other known steps include etching, resist separation, dicing, bonding, and packaging. According to this article manufacturing method, an article of higher quality than those of conventional articles can be manufactured.

Desirable exemplary embodiments of the present invention are described above, but the present invention is not limited to these exemplary embodiments, and can be altered and modified in various ways within the scope of the gist thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-228918, filed Dec. 6, 2018, which is hereby incorporated by reference herein in its entirety.

What is claimed is:

1. An imprint apparatus that cures a curable composition on a substrate in a state where a mold is in contact with the curable composition, the imprint apparatus comprising:
   a substrate holding unit having a plurality of holding regions that holds the substrate; and
   a control unit configured to control a pressure of the plurality of holding regions,
   wherein the control unit cures the curable composition in a state where the control unit controls the pressure so that a shape of a pattern portion of the mold and a shape of a shot region of the substrate coincide with each other, based on at least one of the shape information and the distortion information of the substrate measured by a measuring device.

2. The imprint apparatus according to claim 1, wherein the plurality of holding regions is concentrically segmented, and a height of an outermost partition among a plurality of partitions that partitions the plurality of holding regions is lower than a height of other partitions.

3. The imprint apparatus according to claim 1, wherein the pressure is determined for each of shot regions based on at least one of shape information and distortion information on the substrate where the shot regions are located.

4. The imprint apparatus according to claim 1, wherein the mold has a surface on which a concave-convex pattern is formed, and the pattern formed on the mold is transferred onto the substrate.

5. A method of manufacturing an article, the method comprising:
   exposing a substrate using the imprint apparatus according to claim 1;
   developing the exposed substrate; and
   manufacturing an article from the developed substrate.

* * * * *